United States Patent
Nicolson

(12) 
(10) Patent No.: US 11,135,689 B2
(45) Date of Patent: Oct. 5, 2021

(54) TOOL BLADES AND THEIR MANUFACTURE

(71) Applicant: C4 Carbides Limited, Cambridge (GB)

(72) Inventor: Peter Nicolson, Cambridge (GB)

(73) Assignee: C4 Carbides Limited, Newmarket (GB)

( * ) Notice: Subject to any disclaimer, the term of this patent is extended or adjusted under 35 U.S.C. 154(b) by 0 days.

(21) Appl. No.: 16/682,384

(22) Filed: Nov. 13, 2019

(65) Prior Publication Data

US 2020/0086407 A1 Mar. 19, 2020

Related U.S. Application Data

(62) Division of application No. 15/206,550, filed on Jul. 11, 2016, now abandoned.

(30) Foreign Application Priority Data

Jul. 15, 2015 (GB) ...................................... 1512361
Oct. 30, 2015 (GB) ...................................... 1519222

(51) Int. Cl.
*B23P 15/28* (2006.01)
*B23K 26/34* (2014.01)
(Continued)

(52) U.S. Cl.
CPC .............. *B23P 15/28* (2013.01); *B23D 61/12* (2013.01); *B23D 61/18* (2013.01); *B23D 65/00* (2013.01);
(Continued)

(58) Field of Classification Search
CPC ........ B23D 61/12; B23D 61/18; B23D 65/00; B23K 1/0056; B23K 1/20; B23K 2201/20;
(Continued)

(56) References Cited

U.S. PATENT DOCUMENTS 3,063,310 A 11/1962 Connoy
8,100,997 B2 1/2012 Song et al.
(Continued)

FOREIGN PATENT DOCUMENTS

CN 202079511 U 12/2011
CN 105562825 A 5/2016
(Continued)

OTHER PUBLICATIONS

European Patent Office, English Machine Translation of CN202079511U, published Dec. 21, 2011, retrieved from https://worldwide.espacenet.com on Jul. 27, 2016 (1 page).
(Continued)

*Primary Examiner* — Stephen Choi
(74) *Attorney, Agent, or Firm* — Wood Herron & Evans LLP

(57) ABSTRACT

There is provided a tool blade, comprising a backing strip particles of abrasive material and a binder layer of binding material which binds the abrasive particles along an edge of the backing strip, wherein the edge of the backing strip is pre-formed with teeth, on which the abrasive particles are bound by the binding material. A profiled cutting portion extends beyond the pre-formed teeth. The pre-formed teeth are shaped as generally triangular waves or are flattened at least partially along an upper edge on which the cutting portion is at least partially disposed. A method of making such a blade is also provided.

8 Claims, 2 Drawing Sheets

(51) Int. Cl.

| | |
|---|---|
| *B23K 31/02* | (2006.01) |
| *B23D 61/18* | (2006.01) |
| *B23D 65/00* | (2006.01) |
| *B23D 61/12* | (2006.01) |
| *B23K 15/00* | (2006.01) |
| *B33Y 10/00* | (2015.01) |
| *B33Y 50/02* | (2015.01) |
| *B33Y 80/00* | (2015.01) |
| *B23K 1/20* | (2006.01) |
| *B23K 35/02* | (2006.01) |
| *B23K 1/005* | (2006.01) |
| *B23K 35/30* | (2006.01) |
| *C23C 14/06* | (2006.01) |
| *C23C 14/22* | (2006.01) |
| *B23K 101/34* | (2006.01) |
| *B23K 103/00* | (2006.01) |
| *B23K 101/20* | (2006.01) |

(52) U.S. Cl.
CPC ............. *B23K 1/0056* (2013.01); *B23K 1/20* (2013.01); *B23K 15/0086* (2013.01); *B23K 26/34* (2013.01); *B23K 31/025* (2013.01); *B23K 35/0244* (2013.01); *B23K 35/3033* (2013.01); *B33Y 10/00* (2014.12); *B33Y 50/02* (2014.12); *B33Y 80/00* (2014.12); *C23C 14/0611* (2013.01); *C23C 14/0635* (2013.01); *C23C 14/0647* (2013.01); *C23C 14/22* (2013.01); *B23K 2101/20* (2018.08); *B23K 2101/34* (2018.08); *B23K 2103/52* (2018.08)

(58) Field of Classification Search
CPC . B23K 2201/34; B23K 26/34; B23K 35/0244
See application file for complete search history.

(56) References Cited

U.S. PATENT DOCUMENTS

| | | |
|---|---|---|
| 2005/0048879 A1 | 3/2005 | Skeem et al. |
| 2007/0151554 A1 | 7/2007 | Song et al. |
| 2008/0000466 A1* | 1/2008 | Lehmann ............... B28D 1/124 |
| | | 125/12 |
| 2008/0121084 A1 | 5/2008 | Vogel et al. |
| 2014/0000579 A1 | 1/2014 | Vaneecke et al. |
| 2014/0123827 A1 | 5/2014 | Fuchs et al. |

FOREIGN PATENT DOCUMENTS

| | | |
|---|---|---|
| DE | 9102389 U1 | 5/1991 |
| EP | 2138263 A2 | 12/2009 |
| GB | 1513667 A | 6/1978 |
| GB | 2443252 A | 4/2008 |
| WO | 2010059835 A2 | 5/2010 |
| WO | 2014063910 A1 | 5/2014 |

OTHER PUBLICATIONS

United Kingdom Intellectual Property Office, Patents Act 1977: Search Report under Section 17, Application No. GB1611204.7, dated Jul. 22, 2016 (2 pages).
Espacenet, English Machine Translation of DE9102389U1, dated May 16, 1991, retrieved from https://worldwide.espacenet.com on Nov. 29, 2016 (3 pages).
Espacenet, English Machine Translation of Abstract of CN105562825A, dated May 11, 2016, retrieved from https://worldwide.espacenet.com on Nov. 29, 2016 (1 page).
European Patent Office, European Search Report, Application No. EP16176709, dated Nov. 11, 2016 (2 pages).

* cited by examiner

TOOL BLADES AND THEIR MANUFACTURE

CROSS-REFERENCE TO RELATED APPLICATIONS

The present application is a Divisional application of co-pending U.S. Ser. No. 15/206,550, filed Jul. 11, 2016, which claims priority under 35 U.S.C. § 119 of Great Britain Patent Application Nos. 1512361.5, filed Jul. 15, 2015, and 1519222.2, filed Oct. 30, 2015, the disclosures of which are hereby incorporated herein by reference in their entireties.

FIELD OF THE INVENTION

The present invention relates to tool blades and to methods of making tool blades.

SUMMARY OF THE INVENTION

Examples of the present invention provide a method of making a tool blade, in which:
a. a backing strip is provided;
b. particles of abrasive material are provided;
c. binding material is provided;
d. and the binding material forms a binder layer which binds the abrasive particles along an edge of the backing strip;
wherein the edge of the backing strip is preformed with teeth, prior to the introduction of abrasive particles and binding material;
and wherein the binding material is heated by a beam of radiation to form the binder layer.

The teeth may be preformed to be undersize relative to a desired size, the abrasive particles and binding material coating the teeth to increase the tooth size to the desired size.

Alternatively, the teeth may be preformed to be undersize relative to a desired size, the abrasive particles and binding material coating the teeth to increase the size beyond the desired size, the teeth being processed to return the tooth to the desired size. The teeth may be processed by grinding or other machining, or by laser cutting. The processing may create one or more sharp cutting edges.

The teeth may be formed undersize relative to a desired size, and to a desired shape. The abrasive particles and binding material may form a uniform layer at the surface of the finished teeth.

The teeth may be ground for sharpness. The teeth may be ground after coating with abrasive particles and binding material.

The backing strip may be coated only at the cutting portion of the teeth.

The binding material may be heated by laser radiation.

The abrasive particles may be introduced by projecting or streaming onto the edge of the backing strip, and a high temperature bonding matrix powder may be projected or streamed separately to create precise positioning of the particles. The abrasive particles may have a particle size of 500 microns or less. The abrasive particles may comprise tungsten carbide, or only tungsten carbide, or may comprise other hard metals. The abrasive particles may comprise at least one super abrasive material (such as diamond or cubic boron nitride).

The binding material may be introduced in particle form. The binding material may be introduced by separately projecting, streaming or cascading onto the edge of the backing strip. The binding material may comprise a braze material.

Examples of the present invention also provide a computer-readable medium having computer-executable instructions adapted to cause a 3D printer to print a tool blade in accordance with the method set out above.

Examples of the present invention provide a tool blade, comprising:
a. a backing strip;
b. particles of abrasive material;
c. and a binder layer of binding material which binds the abrasive particles along an edge of the backing strip;
wherein the edge of the backing strip is preformed with teeth, on which the abrasive particles are bound by the binding material.

The binding material and abrasive particles may form a cutting portion profiled to providing a cutting edge.

The profiled cutting portion may extend beyond the pre-formed teeth.

The pre-formed teeth are preferably shaped as generally triangular waves.

The pre-formed teeth may be flattened at least partially along an upper edge on which the cutting portion is at least partially disposed.

The teeth of the backing strip may be undersize relative to a desired size, the abrasive particles and binding material coating the teeth to increase the tooth size to the desired size.

Alternatively, the teeth may be preformed to be undersize relative to a desired size, the abrasive particles and binding material coating the teeth to increase the size beyond the desired size, the teeth being processed to return the tooth to the desired size. The teeth may be processed by grinding or other machining, or by laser cutting. The processing may create one or more sharp cutting edges.

The teeth may be formed undersize relative to a desired size and to a desired shape. The abrasive particles and binding material may form a uniform layer at the surface of the finished teeth.

The teeth may be ground for sharpness. The teeth may be ground after coating with abrasive particles and binding material.

The backing strip may be coated only at the cutting portion of the teeth.

The abrasive particles may have a particle size of 500 microns or less. The abrasive particles may comprise tungsten carbide, or only tungsten carbide, or may comprise other hard metals. The abrasive particles may comprise at least one super abrasive material (such as diamond or cubic boron nitride).

The binding material may comprise a braze material.

BRIEF DESCRIPTION OF THE DRAWINGS

Examples of the present invention will now be described in more detail, by way of example only, and with reference to the accompanying drawings, in which.

DETAILED DESCRIPTION OF THE INVENTION

Figure 1:
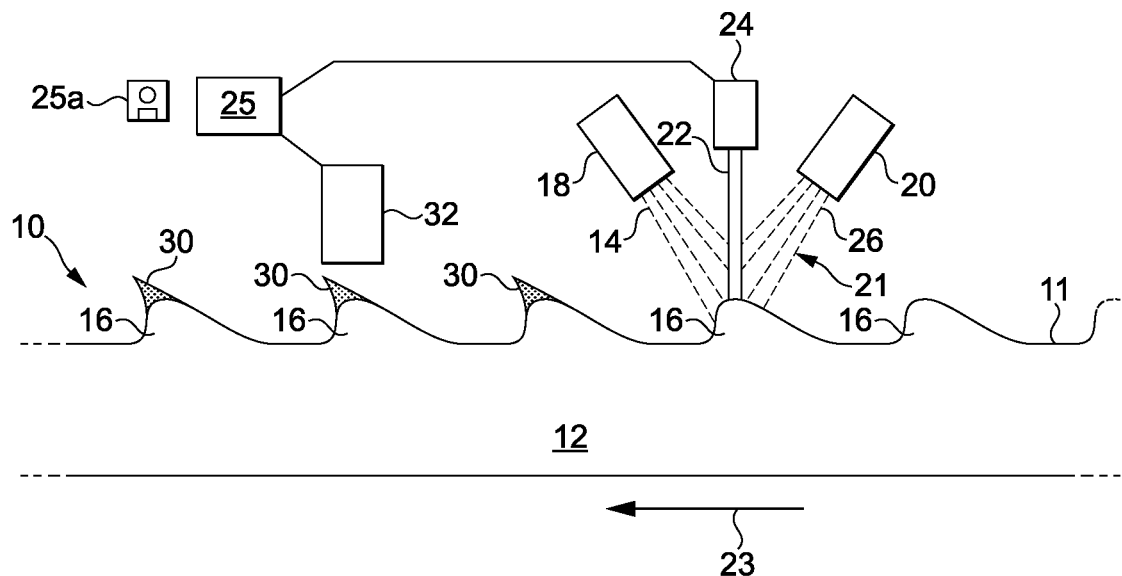
FIG. 1 is a schematic side view indicating a method of making a tool blade.

FIG. 1 illustrates a method of making a tool blade indicated generally at 10 in FIG. 1, but with detail removed in the interests of clarity. In this example, a backing strip 12 is provided. Binding material 14 is provided. This is in powder form and in this example, is projected as a beam or jet onto the backing strip 12 from a source indicated as a hopper 18. In this example, this occurs at a workstation 21 as the backing strip 12 is moving past the workstation 21 in the direction of the arrow 23. One workstation is shown, having two hoppers 18, 20. Other numbers of workstations and hoppers could be chosen.

The binding material powder 14 and the backing strip 12 are heated in the workstation 21 by a beam of radiation 22 from a radiation source 24 to form a binder layer (to be described). Abrasive particles 26 are also provided. The particles 26 are provided at the workstation 21 from a hopper 20 in this example. The abrasive particles are to be bound along an edge 11 of the backing strip 12. This is achieved by the binder layer which is being formed by the binding material.

The edge 11 of the backing strip 12 is preformed with teeth 16, prior to the introduction of abrasive particles 26 and binding material 14. In this example, the teeth 16 are shaped as generally triangular waves along the edge 11. Other shapes could be chosen, including shapes which have straight or curved portions, re-entrant portions, additional crests or other features.

The abrasive particles 26 may comprise tungsten carbide. In one example, the abrasive particles 26 comprise only tungsten carbide. Other abrasive particles could be used such as hard metals or super abrasives (such as diamond or cubic boron nitride). The abrasive particles may have a particle size of 500 microns or less.

Apparatus Used in the Method

In more detail, FIG. 1 illustrates a backing strip 12 in the form of a long steel strip. After the strip 12 has been treated to create a cutting edge along the edge of the strip 12, the strip will be suitable for use as a tool in the form of a linear edge blade for band saws, hacksaws, jigsaws, reciprocating saws, hole saws and other similar tools. Other materials could be used for the backing strip 12.

In this example, the edge 11 of the strip 12 is moved relative to the workstation 21, for the formation of the blade 10. The workstation 21 includes hoppers 18, 20 for providing material in the form of powder projected onto the edge 11 of the strip 12. In this example, two separate hoppers 18, 20 are illustrated and will be described as supplying binding material 14 and abrasive material 26, respectively, so that these materials can be supplied separately or together to the edge 11 of the strip 12. In other examples, there may be only a single source of these materials, in a mixture. Mixtures of more than one binding material may be used, provided by respective sources or from one or more combined sources. The control arrangements of the hoppers 18, 20 allow the delivery of binding material 14 and abrasive particles 26 to be controlled. The rate of delivery may be controlled, and the delivery may be controlled to start and stop. It is envisaged that delivering the materials separately, to be mixed at the edge 11, will improve the level of control available, especially if the different materials have different particle sizes or weights.

The abrasive particles 26 may comprise tungsten carbide, or comprise only tungsten carbide.

The workstation 21 also includes a radiation source 24. In this example, the radiation source 24 is a laser light source. Other types of radiation source could alternatively be used, such as electron beams, plasma beams and others. The purpose of the radiation source 24 is to create heating in the binding material 14, at the edge 11 of the strip 12, in order to form a binder layer, as will be described. Accordingly, a choice of radiation source 24 can be made by considering the nature of the binding material 16, the material of the backing strip 12 and the material of the abrasive particles 26, in order to achieve the results which will be described.

The workstation 21 may be fixed in position, with a feed mechanism (not shown) being provided to feed the strip 12 past the workstation 21. This may be done in a continuous or stepwise fashion. Alternatively, or in addition, the workstation 21 (and in particular, the laser 24) may be arranged to scan along the edge 11 of the strip 12 or toward and away from the edge of the strip 12, either by mechanical means or by optical means. The laser 24 may also be arranged to provide variable intensity, pulses of variable duration, or streams of pulses which have a variable duty cycle (the ratio between the length of on periods and the length of off periods). The frequency or wavelength of the radiation may be varied. The focus position or the shape or size of the focus of the radiation beam may be varied. The incident angle or drag angle of the radiation relative to the strip 12 may be varied. The scanning speed of the radiation, relative to the strip 12, may be varied. These or other variations may be used to create controllable heating effects in the strip 12. This allows the temperature to be controlled at the surface of the binder layer being formed.

A second workstation is illustrated at 32 and is a finishing station for performing a grinding or other machining operation, laser cutting, or otherwise for finishing the blade, as will be described. Alternatively, the second workstation 32 may be part of a separate line for finishing the blade. In a further alternative, the workstation 32 may provide initial machining or finishing, to create a blade in a raw state for subsequent final finishing elsewhere.

The workstations 21, 32 may be controlled by one or more computing devices 25. Consequently, there may be computer-executable instructions adapted to cause the workstations 21, 32 to perform as a 3D printer system to print an abrasive tool blade in accordance with the method being described herein, the instructions being in a computer-readable medium either within the device 25, or removable from the device 25, as illustrated at 25a.

Form of the Backing Strip

The backing strip 12 is preformed with teeth 16. Various different shapes and sizes of teeth 16 could be used. The teeth 16 could all be of the same size and shape. Alternatively, tooth size and/or tooth shape could vary along the backing strip 12.

Figure 2:
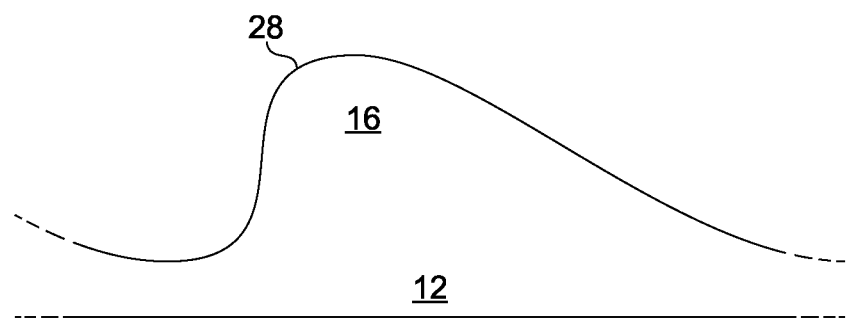
FIGS. 2, 3, 4 and 5 illustrate teeth of the tool blade on an enlarged scale.
Figure 3:
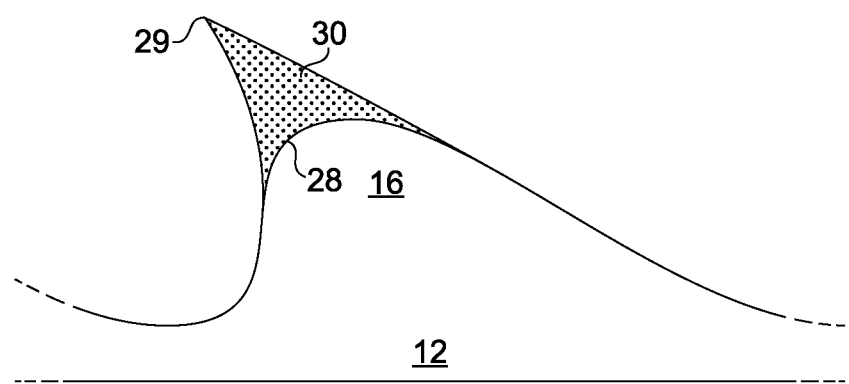

FIG. 2 illustrates a tooth 16 which is generally triangular wave crest in shape and has an exposed tip 28 which will form the cutting portion of the tooth 16, when in use. A coating 30 is formed on the tooth 16 (FIG. 3) by the binding material 14 and the abrasive particles 26. In FIG. 3, it can be seen that the outer surface of the coating 30 has a different shape to the tooth 16 of the backing strip 12, and is larger in size.

Formation of a Binder Layer and Coating

FIG. 1 illustrates the situation as the binder layer 32 is being formed to provide the coating 30. This is the process at the workstation 21. Binding material 14 is projected onto the edge 11 of the strip 12 and the laser 24 is used to illuminate the edge 11 of the strip 12 and the binding material. This has the effect of creating heating. The heating effect causes the binding material to bind to the backing strip 12. In one example, the binding material and/or the backing strip 12 become molten, to achieve a welding effect between the materials. Abrasive particles 26 are also projected onto the edge 11 of the strip 12, so that they become bound along the edge 11 by the action of the binding material 14. The workstation 21 may be controlled so that the backing strip 12 is coated only at the tip 28 of the teeth 16. Alternatively, the backing strip 12 may be coated continuously along its edge.

The binding material may consist of or include a ductile braze material. Alternatively, a hard braze material may be used. The hard braze material may be a nickel braze material. A desired function of the binding material is to create a hard tooth tip or blade edge or other cutting portion of the teeth 16, this tip, edge or portion being also abrasive by virtue of the presence of the abrasive particles 26 and the quality of their bond to the backing strip 12 achieved by the binding material 14.

Tooth Shape and Tooth Finishing

In FIG. 2, the preformed tooth 16 has a rounded wave shape which is generally triangular in shape. The tooth 16 is coated at the workstation 21 with the abrasive particles 26 and binding material 14. The coated tooth 16 is illustrated in FIG. 3. In this example, this coating process increases the tooth size to a desired size indicated by the external outline of the coating 30 (FIG. 3). Prior to coating (FIG. 2), the tooth 16 is under size as compared with the desired size. In this example, the tooth shape also changes while the tooth 16 is coated. That is, the initial tooth shape is not the same as the desired tooth shape. In particular, a sharp edge 29 is formed by the coating process.

After coating the tooth 16, the tooth 16 may be finished by a grinding operation at the second workstation 32 (FIG. 1). For example, the tooth 16 may be ground for sharpness, particularly along the edge 29 of the tip 28.

Figure 4:
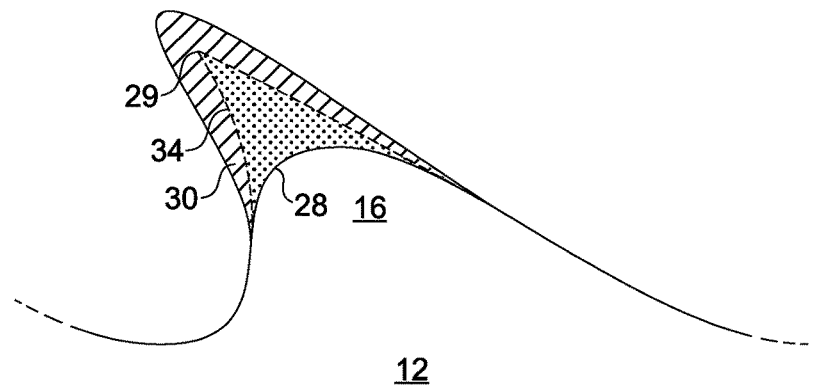

FIG. 4 illustrates an alternative possibility. The uncoated tooth 16 is again a rounded wave shape which is generally triangular in shape and is again coated in the workstation 21 by a coating 30 of abrasive particles 26 and binding material 14. In this example, the tooth 16 is initially undersize as compared with the desired size. The desired size is assumed in this example to be the size shown in FIG. 3, for ease of comparison with the first alternative. The coating 30 is applied sufficiently thickly to increase the tooth size beyond the desired tooth size. This is illustrated in FIG. 4, in which the desired tooth size (corresponding with FIG. 3) is indicated by a broken line 34, and different shading is used inside and outside the desired tooth size, solely for illustrative purposes.

After the tooth 16 has been coated to the oversize condition of FIG. 4, the tooth 16 passes to the second workstation 32. The workstation 32 returns the oversize tooth 16 back to the desired tooth size. This may be by grinding or other machining, laser cutting, or another form of processing.

In these two examples, the initial tooth size is undersize and the initial tooth shape is not correct as compared with the desired tooth size and shape. In consequence, the coating 30 is not uniform in thickness across the surface of the finished tooth. In other examples, the coating process may leave the shape of the tooth unchanged from an initial shape of the tooth 16, in which case the coating 30 will be uniform in thickness across the surface of the finished tooth.

Figure 5:
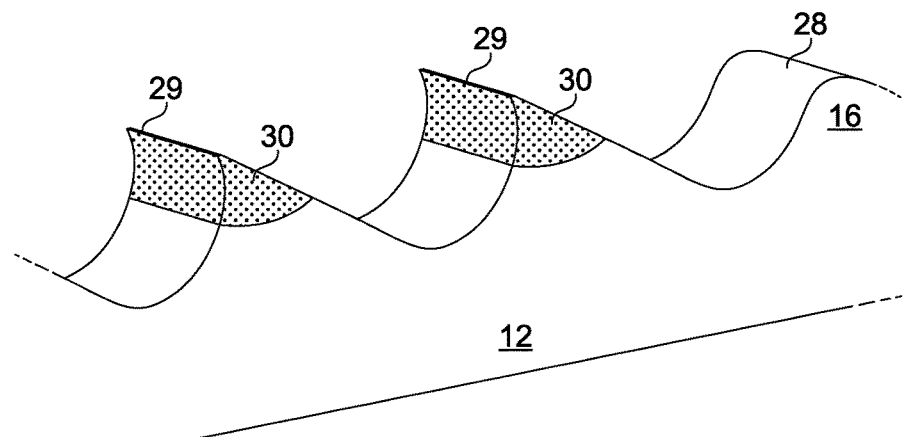

FIG. 5 illustrates two teeth finished as described above (FIGS. 3 and 4), and an uncoated tooth in the form which would be observed prior to the tooth reaching the workstations 21.

The examples described above are expected to provide an improved cutting blade for various reasons, including the following. The mechanical integrity of the teeth is primarily provided by the preformed shape of the teeth on the backing strip, and many different shapes can readily be created along the strip by conventional manufacturing techniques such as machining, stamping, laser cutting, grinding etc. The coating provided by the workstation 21, together with any finishing (if any) provided by the workstation 32, is expected to create a superior tooth performance, for example by virtue of the precise shaping and the ease of varying the tooth shape to suit various materials or applications. Speed of production is expected to increase, with the resulting lower cost, particularly because of the presence of the tungsten carbide or other abrasive material, but without prejudicing the mechanical integrity provided by the preformed teeth. The precise control available from the laser will also minimise the heat affected zone, retaining more of the flexibility and ductility of the backing strip.

It is envisaged that the blade may be coated as described and then sold in uncut strip form for finishing by others, including any required grinding or finishing steps.

Many variations and modifications can be made to the techniques and apparatus described above, without departing from the scope of the present invention set forth herein. For example, many different materials, or combinations of materials, shapes, sizes, relative shapes and relative sizes of structures can be chosen.

While endeavoring in the foregoing specification to draw attention to those features of the present invention believed to be of particular importance it should be understood that the Applicant claims protection in respect of any patentable feature or combination of features hereinbefore referred to and/or shown in the drawings whether or not particular emphasis has been placed thereon.

The invention claimed is:

1. A method of making a tool blade, comprising:
   providing a backing strip;
   providing particles of abrasive material;
   providing binding material which forms a binder layer that binds the abrasive particles along an edge of the backing strip;
   wherein the edge of the backing strip is pre-formed with teeth, prior to the introduction of abrasive particles and binding material;
   heating the binding material laser radiation to form the binder layer on the pre-formed teeth as a sharp edge; and
   during heating of the binding material by the laser radiation, scanning the laser radiation along the edge of the backing strip at a variable speed so as to create controllable heating effects and control a temperature at a surface of the binder layer.

2. The method of making a tool blade according to claim 1, wherein the teeth are pre-formed to be undersize relating to a desired size, the abrasive particles and binding material coating the teeth to increase the size of the coated tooth to the desired size.

3. The method of making a tool blade according to claim 1, wherein the teeth are pre-formed to be undersize relative to a desired size, the abrasive particles and binding material coating the teeth to produce coated teeth with an increased size beyond the desired size, the coated teeth being processed to achieve the desired size.

4. The method of making a tool blade according to claim 1, wherein the abrasive particles are introduced by projecting or streaming onto the edge of the backing strip, and a bonding matrix powder is projected or streamed separately to the abrasive particles to create precise positioning of the particles.

5. The method of making a tool blade according to claim 1, wherein the abrasive particles have a particle size of 500 microns or less.

6. The method of making a tool blade according to claim 1, wherein the binding material is introduced in particle form.

7. The method of making a tool blade according to claim 1, wherein the binding material is introduced separately to the abrasive material by projecting, streaming or cascading the binding material onto the edge of the backing strip.

8. The method of making a tool blade according to claim 1, wherein the binding material comprises a braze material.

* * * * *